United States Patent
Chong et al.

(10) Patent No.: US 7,998,791 B2
(45) Date of Patent: Aug. 16, 2011

(54) PANEL LEVEL METHODS AND SYSTEMS FOR PACKAGING INTEGRATED CIRCUITS WITH INTEGRATED HEAT SINKS

(75) Inventors: Sek Hoi Chong, Melaka (MY); Shee Min Yeong, Melaka (MY); Danny Cher Hau Koh, Melaka (MY); Eugene Kai Poh Wong, Pahang (MY)

(73) Assignee: National Semiconductor Corporation, Santa Clara, CA (US)

( * ) Notice: Subject to any disclaimer, the term of this patent is extended or adjusted under 35 U.S.C. 154(b) by 276 days.

(21) Appl. No.: 12/024,918

(22) Filed: Feb. 1, 2008

(65) Prior Publication Data
US 2009/0194868 A1    Aug. 6, 2009

(51) Int. Cl.
*H01L 21/44* (2006.01)
(52) U.S. Cl. ........ 438/112; 438/122; 438/123; 257/712; 257/E21.502
(58) Field of Classification Search .................. 438/112, 438/122, 123, 124; 257/713, 717
See application file for complete search history.

(56) References Cited

U.S. PATENT DOCUMENTS

| | | | | |
|---|---|---|---|---|
| 5,977,626 A | * | 11/1999 | Wang et al. | 257/707 |
| 5,982,621 A | * | 11/1999 | Li | 361/704 |
| 6,723,585 B1 | * | 4/2004 | Tu et al. | 438/123 |
| 6,818,982 B2 | * | 11/2004 | Kim | 257/707 |
| 6,841,414 B1 | * | 1/2005 | Hu et al. | 438/106 |
| 6,849,932 B2 | | 2/2005 | Tsai et al. | |
| 6,921,683 B2 | * | 7/2005 | Nakayama | 438/122 |
| 6,987,032 B1 | * | 1/2006 | Fan et al. | 438/122 |
| 7,015,072 B2 | * | 3/2006 | Combs et al. | 438/122 |
| 7,196,904 B2 | | 3/2007 | Ku | |
| 2004/0018945 A1 | * | 1/2004 | Khatri | 508/161 |
| 2004/0262746 A1 | * | 12/2004 | Jung | 257/713 |
| 2005/0095875 A1 | * | 5/2005 | Huang et al. | 438/800 |
| 2006/0202313 A1 | * | 9/2006 | Tan et al. | 257/676 |
| 2006/0275608 A1 | * | 12/2006 | Tonapi et al. | 428/413 |
| 2007/0065984 A1 | * | 3/2007 | Lau et al. | 438/107 |
| 2009/0039485 A1 | * | 2/2009 | Lee | 257/676 |

* cited by examiner

*Primary Examiner* — Wael M Fahmy
*Assistant Examiner* — Sarah K Salerno
(74) *Attorney, Agent, or Firm* — Beyer Law Group LLP

(57) ABSTRACT

Panel level methods and arrangements are described for attaching heat sinks in panel form with dice attached to a leadframe panel. Various methods produce integrated circuit packages each having an exposed heat sink on one outer surface of the package and an exposed die attach pad on a second opposite surface of the package.

20 Claims, 7 Drawing Sheets

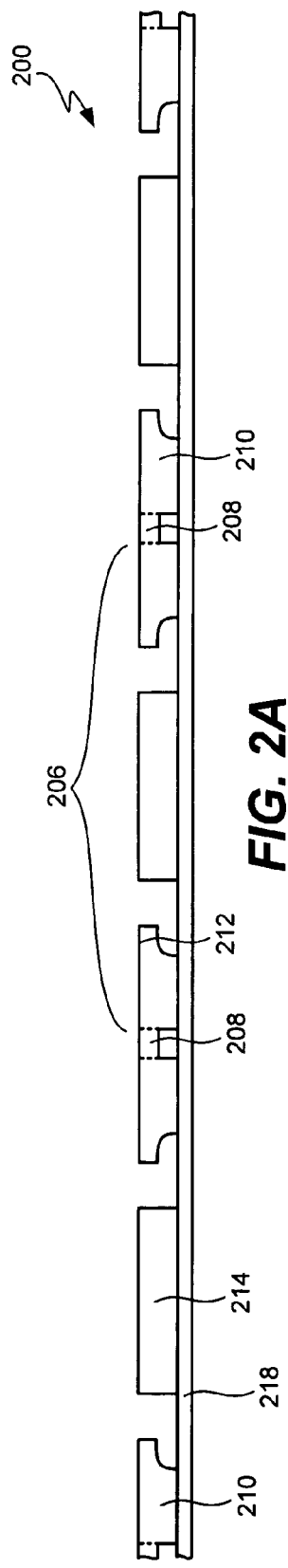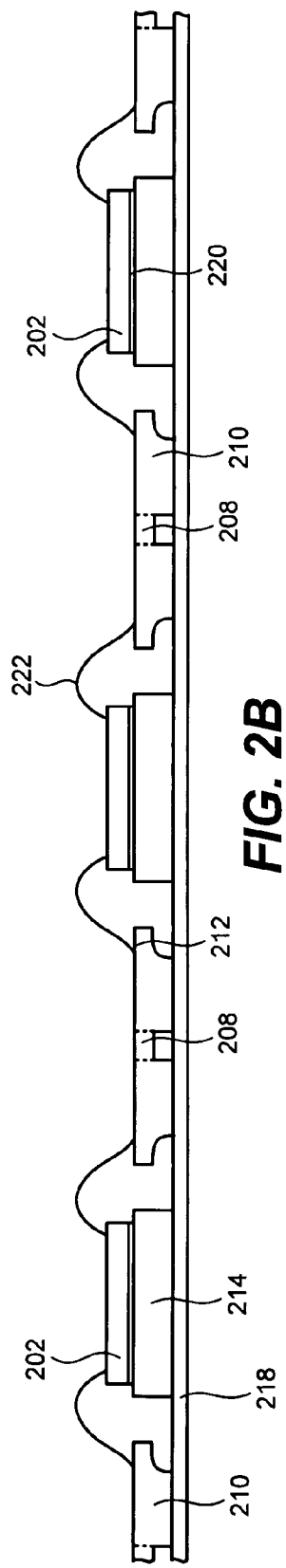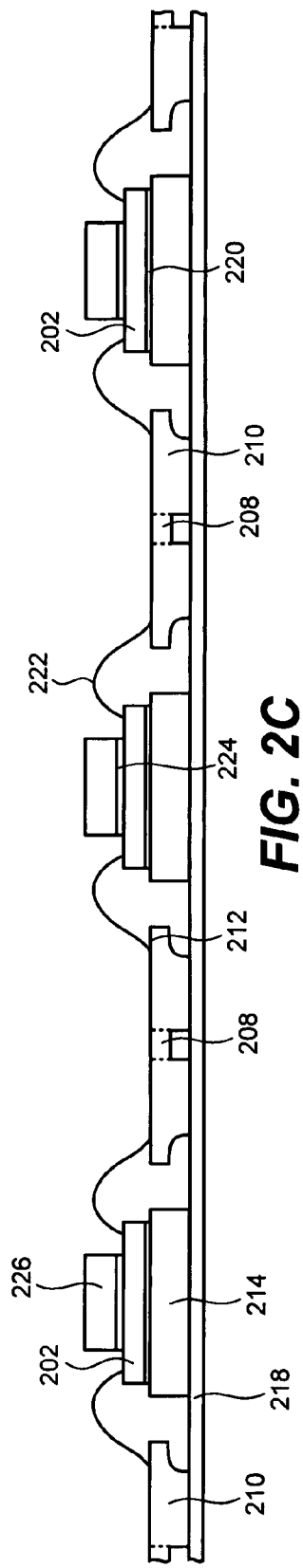

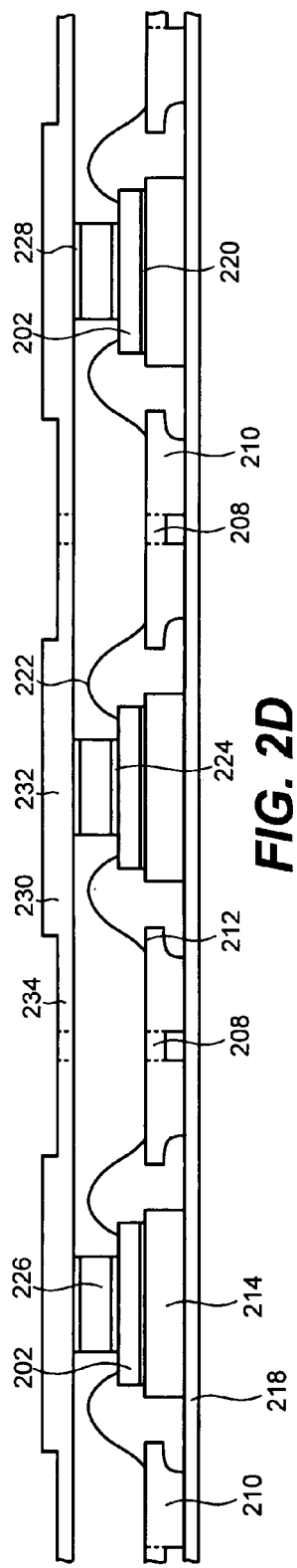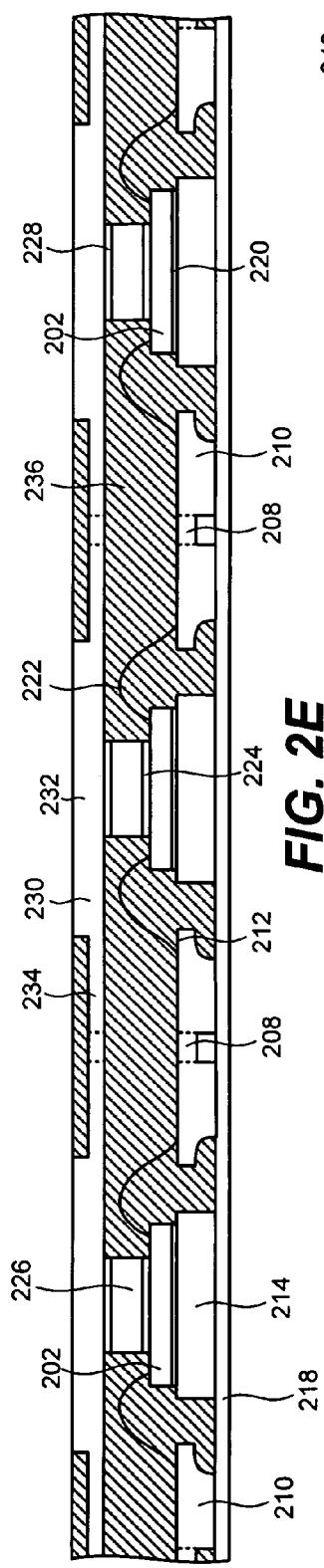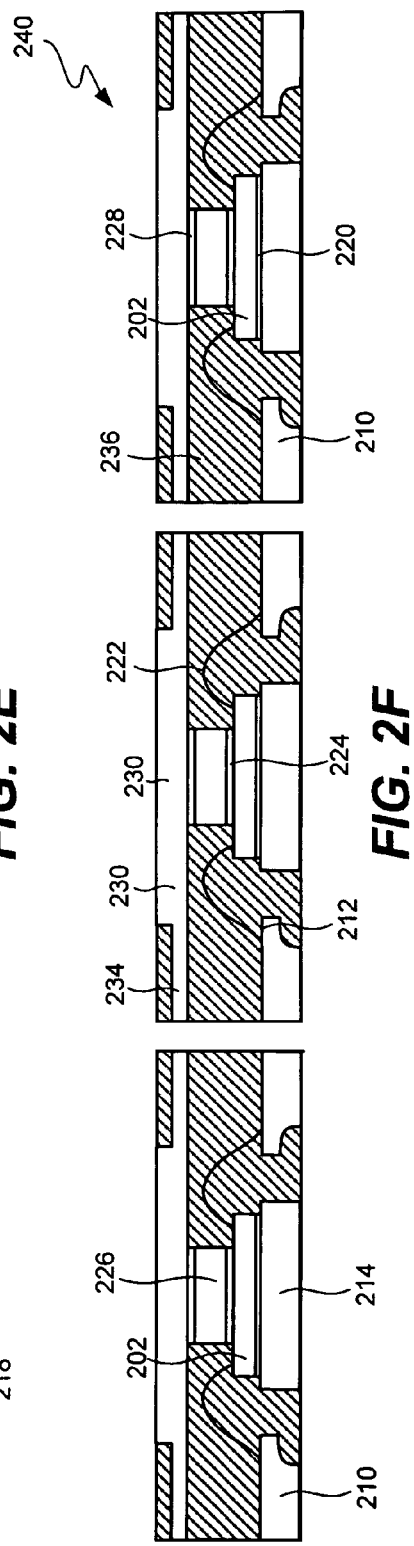

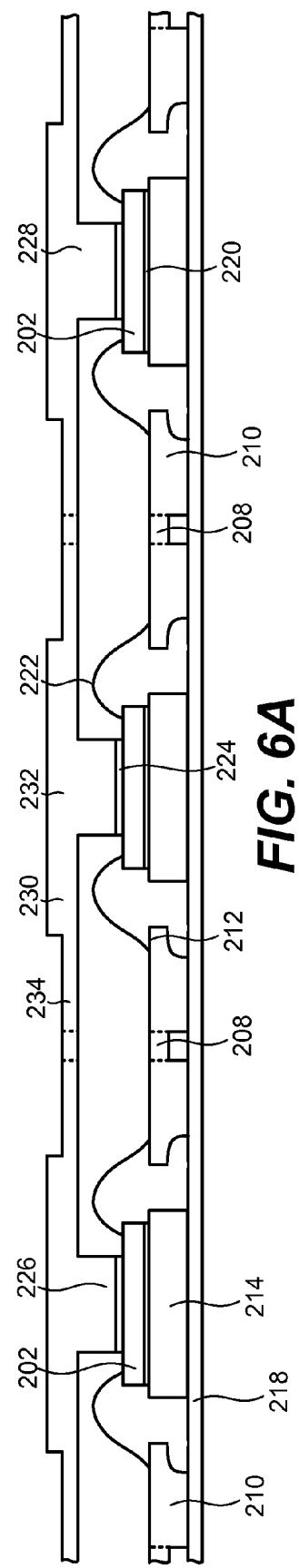

PANEL LEVEL METHODS AND SYSTEMS FOR PACKAGING INTEGRATED CIRCUITS WITH INTEGRATED HEAT SINKS

TECHNICAL FIELD

The present invention relates generally to the packaging of integrated circuits (ICs). More particularly, the present invention relates to a panel level method for attaching heat sinks in IC packages for improved thermal performance.

BACKGROUND OF THE INVENTION

There are a number of conventional processes for packaging integrated circuit (IC) dice. By way of example, many IC packages utilize a metallic leadframe that has been stamped or etched from a metal sheet to provide electrical interconnects to external devices. The die may be electrically connected to the lead frame by means of bonding wires, solder bumps that have been preformed on the active surface of the die, or other suitable electrical connections. In general, the die and portions of the leadframe are encapsulated with a molding material to protect the delicate electrical components on the active side of the die while leaving selected portions of the lead frame exposed to facilitate electrical connection to external devices.

In some applications, it is desirable to leave the back surface (opposite the active surface) of the die (or die attach pad if present) exposed; that is, not to encapsulate the back surface of the die with molding material. By way of example, it may be desirable to leave the back surface of the die exposed in order to increase heat dissipation out of the die. This is especially relevant for packages used in power applications. Additionally, in some applications it is desirable to solder or glue a heat sink to the die to help absorb and dissipate heat from the die. Increasing heat dissipation out of an IC die generally results in greater device performance and stability.

While existing arrangements and methods for packaging IC devices work well, there are continuing efforts to improve the thermal performance of IC devices.

SUMMARY OF THE INVENTION

In one aspect, a method of packaging integrated circuits is described that includes simultaneously attaching a number of integrally connected heat sinks in panel form to associated dice. First, a plurality of IC dice are attached to a leadframe panel. The leadframe panel includes a plurality of device areas, each configured for use in packaging a single IC die. Each die is electrically connected to leads surrounding the die by means of bonding wires. A heat sink panel that includes a plurality of integrally connected heat sinks is positioned over the leadframe panel. Each heat sink is positioned over and thermally coupled with an active surface of an associated die. A spacer positioned between the heat sink and the die provides sufficient clearance between the heat sink and the active surface of the die for the bonding wires. Portions of the leadframe panel, dice and heat sink panel are encapsulated with a molding material. In various embodiments, the leadframe panel and heat sink panel are encapsulated such that bottom surfaces of the leads and an outer surface of each heat sink are left exposed from the molding material. The encapsulated leadframe panel is then singulated to provide a plurality of individual IC packages.

In another aspect, a heat sink panel arrangement for use in the above method is described. The heat sink panel includes a plurality of heat sinks arranged in an array. Each heat sink includes a first portion and at least one associated second portion. The second portions are recessed relative to a first surface of each associated first portion. Each second portion of each heat sink is integrally connected with a second portion of a neighboring heat sink. Additionally, each heat sink is suitably sized and positioned such that when the heat sink panel arrangement is appropriately positioned adjacent to an associated leadframe panel having a plurality of leadframe device areas, each heat sink is positioned adjacent a single leadframe device area. During encapsulation of the associated leadframe panel, the second portions of the heat sinks are entirely encapsulated with molding material while the first surface of each first portion of each heat sink is left unencapsulated with molding material and exposed. The molding material serves to lock the second portions within the molding material thereby securing the heat sinks within the eventual individual packages after the leadframe and heat sink panels are singulated.

BRIEF DESCRIPTION OF THE DRAWINGS

For a better understanding of the invention, reference should be made to the following detailed description taken in conjunction with the accompanying drawings, in which:

FIGS. 2A-2F and 6A illustrate diagrammatic cross-sectional side views of a leadframe panel that is being processed according to various embodiments of the present invention.

Like reference numerals refer to corresponding parts throughout the drawings.

DETAILED DESCRIPTION OF EXAMPLE EMBODIMENTS

The present invention relates generally to the packaging of integrated circuits (ICs). More particularly, the present invention relates to a panel level method for attaching heat sinks in IC packages for improved thermal performance.

In the following description, numerous specific details are set forth to provide a thorough understanding of the present invention. It will be apparent, however, to one skilled in the art that the present invention may be practiced without some or all of these specific details. In other instances, well known process steps have not been described in detail in order to avoid unnecessary obscuring of the present invention.

Various embodiments of the present invention will be described with reference to FIGS. 1-5. Aspects of the present invention provide a panel level method for packaging IC dice such that each resultant package includes a heat sink that is at least partially locked within the package with molding material. Primarily, the heat sink serves to increase thermal dissipation out of the die.

Figure 1:
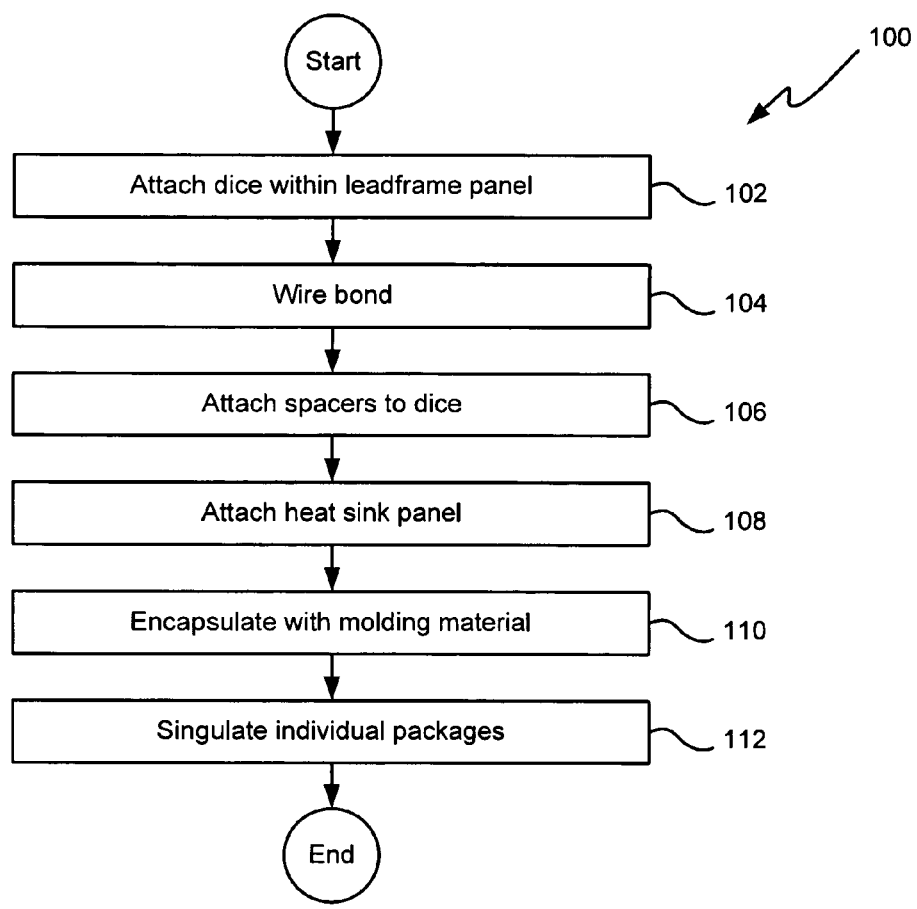
FIG. 1 is a flowchart illustrating a process for packaging IC dice with integrated heat sinks in accordance with an embodiment of the present invention.
Figure 3A:
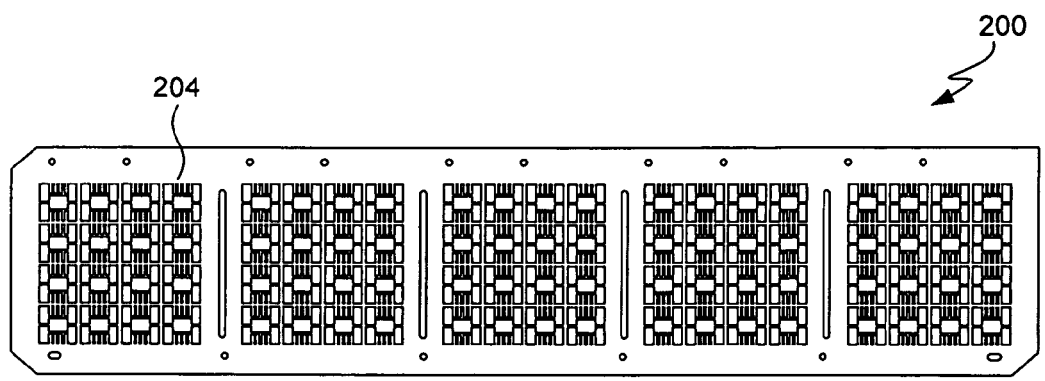
FIGS. 3A-3C illustrate an example leadframe panel suitable for use in various embodiments of the present invention.
Figure 3B:
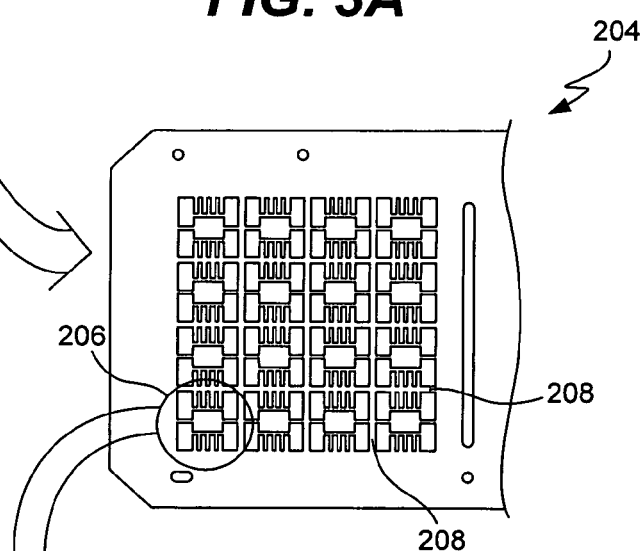
Figure 3C:
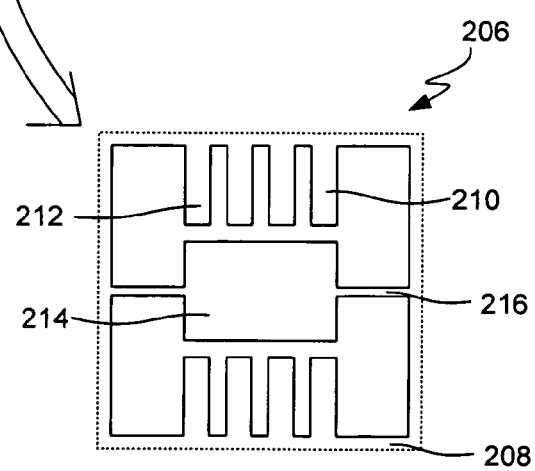

Referring initially to FIG. 1, and further in view of FIGS. 2A-F, a process 100 of preparing and packaging IC dice in accordance with particular embodiments of the present invention will be described. Initially, at 102, a multiplicity of dice 202 are positioned within associated device areas of a suitable substrate such as a leadframe panel, as illustrated in FIG. 2B. With respect to FIGS. 3A-C, an exemplary leadframe panel 200 suitable for use in packaging integrated circuits according to various embodiments of the present invention will be described. FIG. 3A illustrates a diagrammatic top view of a leadframe panel 200 arranged in the form of a strip. The leadframe panel 200 can be configured as a metallic structure with a number of two-dimensional arrays 204 of device areas. As illustrated in the successively more detailed FIGS. 3B-C, each two-dimensional array 204 includes a multiplicity of device areas 206, each configured for use in a single IC package, and each connected by a matrix of fine tie bars 208 (defined in the FIGS. 2A-E with dotted lines).

Each device area 206 may include a number of leads 210, each supported at one end by the tie bars 208. In the illustrated embodiment, the leads 210 include conductive contact surfaces 212 to provide conductive contact regions to electrically connect the leads to associated I/O pads on the dice. The leads 210 additionally include package contacts on the bottom surface of the leadframe. Each device area 206 may also include a die attach pad 214 suitable for receiving an associated die 202, although in alternate embodiments a die attach pad may not be included. Each die attach pad 214 may be supported by associated die attach pad support bars 216 that connect the die attach pad 214 to the tie bars 208. The leads 210 and/or die attach pad 214 may be etched, half-etched, or otherwise thinned relative to the package contacts, so as to provide electrical connection to the contacts while limiting the exposed conductive areas on the bottom surface of the leadframe panel 200. Additionally, it may also be desirable to etch or otherwise thin the top surface of the leadframe as well.

To facilitate handling, and also for encapsulation purposes, the bottom surface of the lead frame may be adhered to a high-temperature tape 218. In embodiments in which die attach pads 214 are included, bottom surfaces of the dice 202 may be attached to corresponding die attach pads within the device areas 206 with a suitable die attach adhesive 220. By way of example, a conventional die attach epoxy or adhesive film may be used to attach the dice 202 to the die attach pads 214. Alternatively, in embodiments in which die attach pads are not included, the dice 202 may be positioned and adhered directly onto the tape 218 in a die attach area located within each device area 206.

It will be appreciated by those skilled in the art that, although a specific leadframe panel 200 has been described and illustrated, the described methods may be applied in packaging dice utilizing an extremely wide variety of other leadframe panel or strip configurations as well as other similar substrates. By way of example, in the illustrated embodiment, the leads 210 are arranged into a dual inline package (DIP) format; however, in other embodiments, the leads may be arranged into a quad-flat pack no-lead (QFN) format or microarray format. Thus, although the following description of particular embodiments describes the packaging of dice utilizing specific leadframe technology, those of skill in the art will understand that embodiments of the present invention may also be practiced using other substrates. Additionally, although described with references to a top and bottom surface of the leadframe panel 200, it should be appreciated that this context is intended solely for use in describing the structure and in no way limits the orientation of the leadframe for subsequent attachment to a PCB or other suitable substrate.

After attaching the dice 202 to the leadframe panel 200, I/O pads on the active surface of the dice are electrically connected at 104 to the contact surfaces 212 on the leads 210 by means of metallic (e.g., gold) bonding wires 222. It should be noted that, while aspects of the present invention are particularly well-suited for use in packaging dice that utilized bonding wires, any suitable electrical connections may be used.

At 106, a spacer 226 is attached to a central region of the active surface of each die 202 as illustrated in FIG. 2C. Although any suitable method may be used to position the spacers 226 onto their respective dice 226, in one embodiment, a conventional pick-and-place machine (such as that used in positioning the dice onto the leadframe panel) is used in positioning the spacers. In various embodiments, each spacer 226 is formed from a thermally conductive material. By way of example, each spacer 226 may be formed from copper, a copper alloy or another suitable metal or metallic alloy. The geometry of each spacer 226 may also be widely varied. In one embodiment, the spacer takes the form of a pedestal having a square or rectangular cross-section, although the pedestal may have any appropriate cross-section that permits wire bonding to I/O pads located in regions of the active surfaces of the dice surrounding the spacers 226. By way of example, in another embodiment the spacer may be in the form of a cylindrical pedestal having a circular cross-section. The lengths, widths (or diameters) and thicknesses (or heights) of the spacers 226 may also be widely varied. By way of example, in one embodiment the spacer has a length and width both equal to approximately 4 mm and a thickness of approximately 75 to 150 µm, although thinner and thicker spacers may be desirable. In general, the size and shape of the spacers 226 will vary according to many factors, including the die size, I/O pad layout and desired package constraints, among others. Of note, the top surface of each spacer 226 is preferably higher than the surrounding bonding wires 222.

A thermal interface material layer 224 applied to the central region of the active surface of each die 202 is used in securing each spacer 226 with the associated die 202. The thermal interface material layer 224 may be formed from any suitable material. Preferably, the thermal interface material layer 224 is formed of one of a wide variety of thermally conductive materials. In various embodiments, the thermal interface material layer 224 is formed from a thermally conductive adhesive. In some particular embodiments, the thermally conductive adhesive may be a thermally curable liquid adhesive that is both thermally conductive and electrically insulating. Specifically, when cured, the thermally conductive adhesive may have a thermal conductivity of at least approximately 1.9 W/m° C. However, it will be appreciated by those familiar with the art that a wide variety of other thermally conductive adhesive materials and, more generally, thermal interface materials may be used. By way of example, in some embodiments, the thermal interface material layer 224 is formed from a B-stageable adhesive. A B-stageable adhesive is an adhesive that may be cured in two stages; that is, the B-stageable adhesive may be partially cured at one stage and fully cured at a later stage. If a B-stageable adhesive or similar material is used, the thermal interface material layer 224 may be partially cured by any suitable means after the spacer 226 is positioned appropriately.

In some embodiments, the thermal interface material layer 414 is applied to the active surface of each individual die 202 in liquid form using an appropriate dispenser. However, it will be appreciated that any suitable method may be used to deposit the thermal interface material layer 224 onto the active surfaces of the dice 202. Generally, the method of application will depend on the choice of the material used to form the thermal interface material layer 224. The desired thickness of the thermal interface material layer 224 may also vary widely according to the choice of material. By way of example, a thermal interface material layer 224 formed of a thermally conductive adhesive may have a thickness in the range of approximately 20 to 30 microns (μm).

Figure 4A:
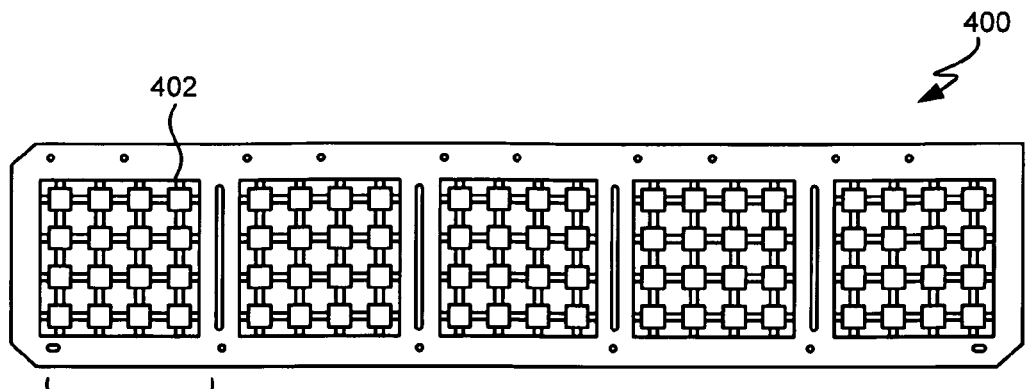
FIGS. 4A-4C illustrate diagrammatic top views of a heat sink panel suitable for use in accordance with embodiments of the present invention.
Figure 4B:
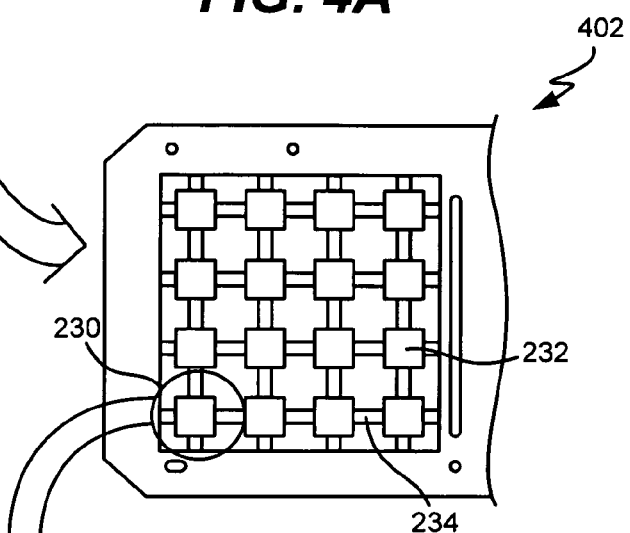
Figure 4C:
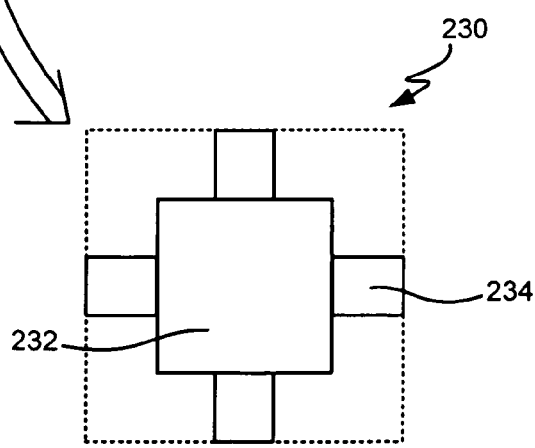

At 108, a heat sink panel is positioned over and attached to the dice 102 as illustrated in FIG. 2D. With respect to FIGS. 4A-C, an exemplary heat sink panel 400 suitable for use in packaging integrated circuits according to various embodiments of the present invention will be described. FIG. 4A illustrates a diagrammatic top view of a heat sink panel 400 arranged in the form of a strip. The heat sink panel 400 can be configured as a metallic structure with a number of two-dimensional arrays 402. By way of example, the heat sink panel 400 may be constructed from a suitable thermally conductive metal or metallic alloy, such as copper or a copper alloy. In various embodiments, some or all portions of the heat sink panel may be plated with nickel. As illustrated in the successively more detailed FIGS. 4B-C, each two-dimensional array 402 includes a multiplicity of heat sinks 230, each heat sink being configured for use in a single IC package. Each heat sink 230 generally includes a central portion 232 and surrounding peripheral tab portions 234.

In the illustrated embodiment, each heat sink 230 is integrally interconnected with at least two other heat sinks via their respective peripheral tab portions 234. The top surfaces of the peripheral tab portions 234 are recessed relative to the top surfaces of the central portions 232. By way of example, the peripheral tab portions 234 may be half-etched relative to the central portions 232. The thickness of the central portions 232 may vary widely. By way of example, thicknesses in the range of approximately 75-150 μm work well, although thinner or thicker central portions may be desirable and are permitted. In a preferred embodiment, at least the top surface of each central portion 232 is plated with nickel, a nickel alloy, or some other suitable metal or metallic alloy that resists corrosion and, in some embodiments, is solder-wettable. In the illustrated embodiment, each central portion 232 assumes a rectangular shape and an associated tab portion 234 extends from each side of the associated central portion. Although a specific heat sink panel arrangement has been described and illustrated, it will be appreciated that an extremely wide variety of other suitable heat sink panel arrangements and heat sink shapes may be suitable as well. By way of example, the central portion may have a circular cross-section.

The heat sink panel 400 is positioned such that the bottom surface of each central portion 233 of each heat sink 230 is positioned over and secured to an associated spacer 226. In this way, the spacers 226 prevent the heat sinks 230 from contacting or damaging the delicate bonding wires 222 that electrically connect the dice 202 to the leads 210. Any suitable method or material may be used in connecting the heat sinks 230 to the spacers 226. By way of example, in some embodiments, the same thermal interface material used in layer 224 may be used to form an adhesive layer 228 over each spacer 226. Here it should be noted that, in some alternate embodiments, the spacers 226 may be integrally formed with the heat sink panel 400, thus eliminating the need for attaching spacers to the heat sinks 230. By way of example, the bottom surface of the heat sink panel 400 may be etched to define the spacers 226 such that a spacer is defined below each central portion 232 of each heat sink 230. FIG. 6A illustrates an example of a heat sink panel 400 with integrally formed spacers 226.

In some embodiments, it is necessary or desirable to cure the thermal interface material layers 224 and/or 228 to complete attachment of the heat sinks 230 to the dice 202. Depending upon its material composition, the thermal interface material layers 224 and 228 may be cured thermally, such as in an oven, through exposure with radiation, such as ultraviolet (UV) radiation, or by any other suitable means.

At 110 portions of the dice 202, leadframe panel 200 and heat sink panel 400 are encapsulated with a molding material or compound 236 as illustrated in FIG. 2E. The molding compound is generally a non-conductive plastic or resin having a low coefficient of thermal expansion. In a preferred embodiment, the entire populated leadframe panel 200 and heat sink panel 400 are positioned in the mold such that the entire die-populated panels may be encapsulated substantially simultaneously, or more particularly, such that each array 204 (and corresponding array 402) is encapsulated as a single unit and each array is encapsulated substantially simultaneously as the other arrays. It should be appreciated that a lesser number of dice 202 may also be encapsulated at any one time.

It should additionally be appreciated that virtually any molding system may be used to encapsulate the attached dice 202 and panels 200 and 400. By way of example, a film assisted molding (FAM) system may be used to encapsulate the attached dice. In such a system, a vacuum may be used to draw a film or tape to the inner surfaces of the molding cavity. By way of example, the film used within the mold cavity may be a thermoplastic adhesive film. In this way, portions of the leadframe panel 200 and heat sink panel 400 that would make contact with the mold cavity during encapsulation instead make contact with the adhesive film. Thus, in one embodiment, during encapsulation, the top surface of the central portion 232 is in contact with the adhesive film, which is turn in contact with the mold cavity. The adhesive film prevents mold compound intrusion over the central portions 232, under the die attach pads 214, and under the package contacts at the bottom surfaces of the leads 210. However, FAM systems are not always available or applicable to particular leadframe configurations. Hence, in another embodiment, an adhesive film may not be used whereby the central portion 232 itself is in contact with the mold cavity.

During the encapsulation process, the mold cavity is pressed against the top surface of each central portion 232. As a result, molding material is prevented from covering or intruding over the central portion 232. However, molding material does encapsulate the die 202, bonding wires 222, portions of the leads 210 and die attach pads 214 and, particularly, the peripheral tab portions 234 of the heat sinks 230 as illustrated in FIG. 2E. The molding material 236 covering the peripheral tab portions 234 provides a locking feature that secures the heat sinks 230 within the molding material.

Figure 5A:
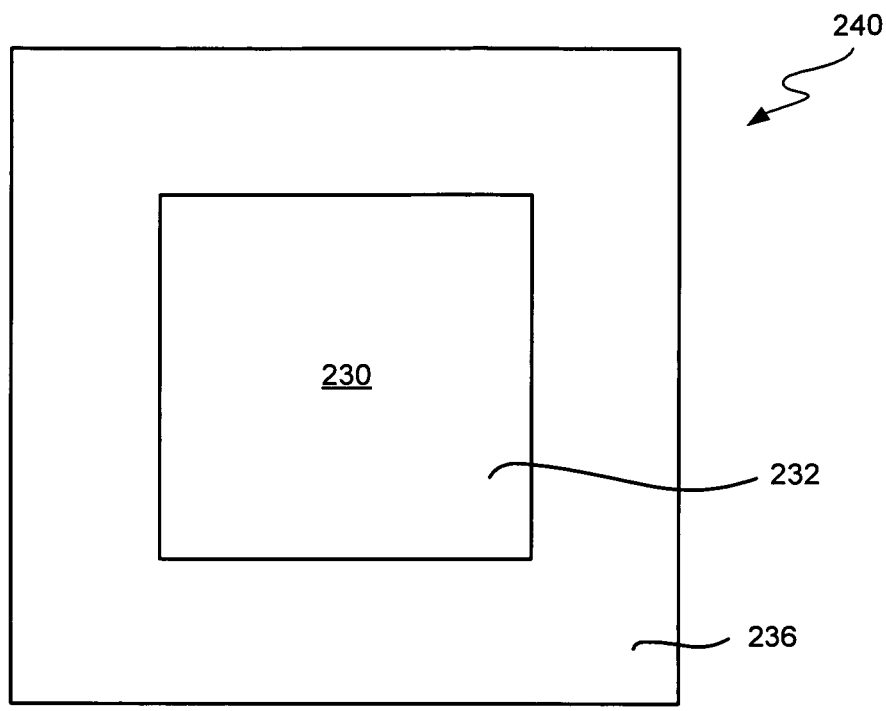
FIGS. 5A-5B illustrate diagrammatic top and bottom views of an IC package in accordance with an embodiment of the present invention.
Figure 5B:
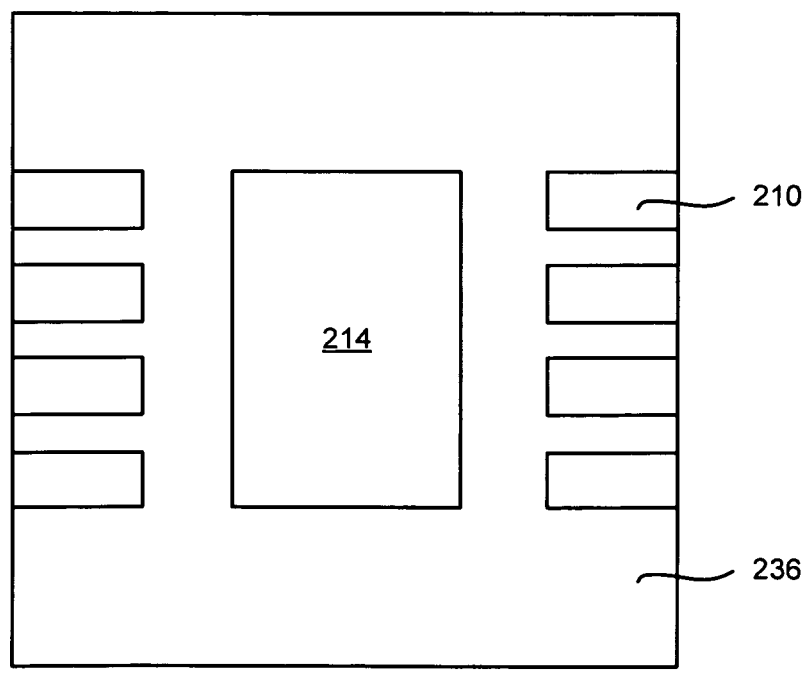

Subsequently, the molding compound may then be cured in a heated oven. After curing the molding compound, the encapsulated leadframe panel 200 and heat sink panel may then be singulated at 112 to yield a plurality of individual IC packages 240 each having an integrated heat sink 230 exposed on the one surface of the package and a die attach pad 214 exposed on an opposite surface of the package. As described earlier, it is preferable in one embodiment that at least the exposed central portion of each heat sink 230 is plated with nickel or a nickel alloy. The individual packages may be singulated using any suitable method such as, by way of example, sawing, gang-cutting, plasma cutting and laser cutting. Upon package singulation, the IC packages 240 may be attached to PCBs or other desired substrates via the package contacts on the bottom surfaces of the leads 210. FIGS. 5A-5B illustrate diagrammatic top and bottom views, respectively, of an IC package 240. As described earlier, some designs contemplate a leadframe panel without die attach pads. Accordingly, reference number 214 of FIG. 5B may refer instead to the exposed back surface of a die or to an exposed thin metallic layer that has been deposited over the back surface of a die.

In embodiments in which die attach pads are not included, the back surface of each dice 202 itself will be exposed on the bottom surface of the associated package 240. In these embodiments, it may be desirable to apply a thin metallic layer or thin metallic layer stack to the back surfaces of the dice 202 prior to singulating the dice from their respective wafer and attaching the dice to the tape 218. The thin metallic layer may be formed from any suitable metal or metallic alloy. By way of example, the thin stacked metallic layer may be an alloy of titanium, nickel and silver. The thin stacked metallic layer may also be applied to the back surfaces of the dice 202 with any suitable means including, for example, sputtering or thermal evaporation. The thin metallic layer on the back surface of the die 202 may be solder-wettable to facilitate electrical connection to external contacts.

Generally, it is desirable to limit the amount of metallic material that must be cut through to singulate the individual packages 240. As such, the illustrated peripheral tab portions 234 are designed so as to reduce the amount of metal that is removed during singulation. However, as described earlier, the heat sinks 230 may be arranged into a wide variety of other suitable geometries. Additionally, the central portions 232 may be designed to further enhance the thermal dissipation out of each package 240. By way of example, the top portion 232 may include fins or other heat dissipation structures formed by etching into the top surface of the central portion 232. Some examples of such structures can be found in copending U.S. patent application Ser. No. 11/933,990 filed Nov. 1, 2007 and entitled INTEGRATED CIRCUIT PACKAGE WITH INTEGRATED HEAT SINK, which is hereby incorporated by reference herein in its entirety for all purposes. By way of example, portions of the ledge region described in application Ser. No. 11/933,990 may extend to form the peripheral tab portions 234 described in the present application. Additionally, the peripheral region of the central portion 230 may form a partition that surrounds heat dissipation structures such as fins or posts.

The described methods and arrangements may be used to produce IC packages having improved thermal performance due to increased thermal dissipation out of two opposite sides of the package as a result of incorporating both an exposed die attach pad and an exposed integrated heat sink. Furthermore, the package includes a mold locking feature that secures the heat sink within the package. Moreover, the attachment of the heat sinks in panel form to the dice within the populated leadframe panel provides increased throughput.

The foregoing description, for purposes of explanation, used specific nomenclature to provide a thorough understanding of the invention. However, it will be apparent to one skilled in the art that the specific details are not required in order to practice the invention. Thus, the foregoing descriptions of specific embodiments of the present invention are presented for purposes of illustration and description. They are not intended to be exhaustive or to limit the invention to the precise forms disclosed. It will be apparent to one of ordinary skill in the art that many modifications and variations are possible in view of the above teachings.

The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

What is claimed is:

1. A method of packaging integrated circuits, comprising:
attaching a plurality of dice to a leadframe panel, each die being positioned within a device area of the leadframe panel, each device area including a plurality of leads that surround the die;
electrically connecting the dice to associated leads within their respective device areas with electrical connections;
positioning a heat sink panel over the leadframe panel, the heat sink panel including a plurality of integrally connected heat sinks, each heat sink having a top surface and an opposing bottom surface that both overlie an active surface of an associated die, the bottom surface of the heat sink being positioned over and thermally coupled with the active surface of the associated die using an associated spacer, wherein the associated spacer does not extend beyond the periphery of the active surface of the associated die and wherein the heat sinks of the heat sink panel are connected through tab portions that are recessed relative to the top surfaces of the heat sinks;
pressing the top surface of each heat sink flush against a mold cavity to help seal off the top surfaces of the heat sink, there being gaps between the recessed tab portions of the heat sink panel and the mold cavity;
encapsulating portions of the leadframe panel, dice and heat sink panel with a molding material such that the molding material enters the gaps between the recessed tab portions and the mold cavity to cover the tab portions of the heat sink panel while leaving the top surface of each heat sink uncovered with molding material, wherein the encapsulated heat sink panel is physically supported over the leadframe panel only by the molding material and the spacers that are attached to the active surfaces of the dice; and
singulating the leadframe panel, molding material and heat sink panel to provide a plurality of individual integrated circuit packages, whereby each integrated circuit package includes an associated die and an associated heat sink that is exposed on an outer surface of the integrated circuit package, wherein any spacer within each integrated circuit package that attaches to the associated heat sink is positioned directly between the active face of the associated die and the associated heat sink.

2. A method as recited in claim 1, further comprising attaching a spacer to the active surface of each die prior to positioning the heat sink panel over the dice and leadframe panel, the spacer providing sufficient clearance for the electrical connections between the heat sink panel and the active surface of the die.

3. A method as recited in claim 2, wherein each heat sink from the heat sink panel is attached to an associated spacer with a thermal interface material.

4. A method as recited in claim 3, wherein the thermal interface material layer is formed of a thermally conductive adhesive material.

5. A method as recited in claim 3, wherein the thermal interface material layer is formed of an electrically insulating material.

6. A method as recited in claim 3, wherein the thermal interface material layer is formed of a B-stageable adhesive material.

7. A method as recited in claim 3, wherein bonding wires are used to electrically connect each die to the associated leads surrounding the die and wherein the spacer provides sufficient clearance for the bonding wires below the associated heat sink.

8. A method as recited in claim 2, wherein the spacer is attached with the active surface of an associated die with a thermal interface material.

9. A method as recited in claim 8, wherein the thermal interface material layer is formed of a thermally conductive adhesive material.

10. A method as recited in claim 8, wherein the thermal interface material layer is formed of an electrically insulating material.

11. A method as recited in claim 8, wherein the thermal interface material layer is formed of a B-stageable adhesive material.

12. A method as recited in claim 1, wherein each heat sink includes an integrally formed spacer, wherein the spacer is attached to the active surface of the associated die and wherein the spacer provides sufficient clearance for the electrical connections between the heat sink panel and the active surface of the die.

13. A method as recited in claim 1, wherein during the encapsulating an outer surface of a first portion of each heat sink is left unencapsulated with molding material and exposed on the outer surface of the encapsulated leadframe panel, and wherein a second portion of each heat sink is entirely encapsulated with molding material whereby the molding material covering the second portion provides a locking feature that secures the second portion within the molding material thereby securing the heat sink within the package.

14. A method as recited in claim 13, further comprising singulating the leadframe panel, molding material and heat sink panel to provide a plurality of individual integrated circuit packages, whereby each integrated circuit package includes one heat sink that is exposed on an outer surface of the associated package.

15. A method as recited in claim 14, wherein each device area of the leadframe panel includes a die attach pad, wherein a back surface of each die is attached to a die attach pad and wherein an outer surface of each die attach pad is left unencapsulated with molding material and exposed at an outer surface of the package.

16. A method as recited in claim 14, wherein a back surface of each die is left unencapsulated with molding material and exposed at an outer surface of the package.

17. A method as recited in claim 16, wherein the back surface of each die includes a thin metallic layer deposited over the back surface of the die.

18. A method as recited in claim 1, wherein each spacer does not extend beyond the periphery of the active surface of the associated die such that the entire spacer is positioned directly between the active surface of the associated die and the heat sink panel.

19. A method as recited in claim 1, wherein the positioning of the heat sink panel over the leadframe panel is performed such that there is no support structure other than said spacers that directly connects to the heat sink panel and that extends between the heat sink panel and the leadframe panel.

20. A method as recited in claim 1, wherein:
before the positioning of the heat sink panel and after electrically connecting the dice, depositing a thermal interface layer onto the active surface of each die; and
after applying the thermal interface layer on each die, attaching the spacer to the active surface of each die using the thermal interface layer, wherein the spacer does not extend beyond the periphery of the active surface of the die such that the entire spacer is positioned directly between the active surface of the die and the heat sink panel,
wherein the positioning of the heat sink panel over the leadframe panel is performed such that there is no support structure other than said spacers that directly connects to the heat sink panel and extends between the heat sink panel and the leadframe panel.

* * * * *